United States Patent
Mayer

(10) Patent No.: US 7,634,700 B2
(45) Date of Patent: Dec. 15, 2009

(54) SEMICONDUCTOR DEVICE WITH TEST INTERFACE

(75) Inventor: Albrecht Mayer, Deisenhofen (DE)

(73) Assignee: Infineon Technologies AG, Neubiberg (DE)

( * ) Notice: Subject to any disclaimer, the term of this patent is extended or adjusted under 35 U.S.C. 154(b) by 322 days.

(21) Appl. No.: 11/465,540

(22) Filed: Aug. 18, 2006

(65) Prior Publication Data

US 2007/0061650 A1    Mar. 15, 2007

(30) Foreign Application Priority Data

Aug. 19, 2005    (DE) .................. 10 2005 039 348

(51) Int. Cl.
*G01R 31/28* (2006.01)
(52) U.S. Cl. ...................... 714/724; 714/731
(58) Field of Classification Search ............... 714/724, 714/733
See application file for complete search history.

(56) References Cited

U.S. PATENT DOCUMENTS

| | | | | |
|---|---|---|---|---|
| 5,369,377 | A * | 11/1994 | Benhamida | 331/49 |
| 5,434,804 | A | 7/1995 | Bock et al. | |
| 6,195,775 | B1 * | 2/2001 | Douskey et al. | 714/727 |
| 7,055,045 | B1 * | 5/2006 | Gaboriau et al. | 713/300 |
| 7,284,174 | B2 * | 10/2007 | Dubey | 714/727 |

FOREIGN PATENT DOCUMENTS

| | | |
|---|---|---|
| JP | 61-148378 | 7/1986 |
| JP | 62-022085 | 1/1987 |
| JP | 03-265203 | 11/1991 |
| JP | 2005-140759 | 6/2005 |

OTHER PUBLICATIONS

"IEEE Standard Test Access Port and Boundry-Scan Architecture", Test Technology Standards Committee of the IEEE Computer Society, IEEE Std. 1149.1-1990.
"TC1796-32-Bit Single-Chip Microcontroller Volume 1 (of 2): System Units" Infineon Technologies User Manual, V1.0, Jun. 2005.
"Japanese Office Action mailed Jun. 9, 2009".

* cited by examiner

*Primary Examiner*—Kevin L Ellis
*Assistant Examiner*—Steve Nguyen
(74) *Attorney, Agent, or Firm*—Dicke, Billig & Czaja, PLLC

(57) ABSTRACT

A semiconductor device with test interface, as well as to a method for operating a semiconductor device is disclosed. In one embodiment, in a test operating mode, the semiconductor device is, via a first pin, supplied with a work cycle signal synchronized with a test environment and, via at least one second pin, with test data. In accordance with a first embodiment it is suggested, so as to reduce the number of pins, that the work cycle signal is simultaneously used as test data clock signal.

12 Claims, 3 Drawing Sheets

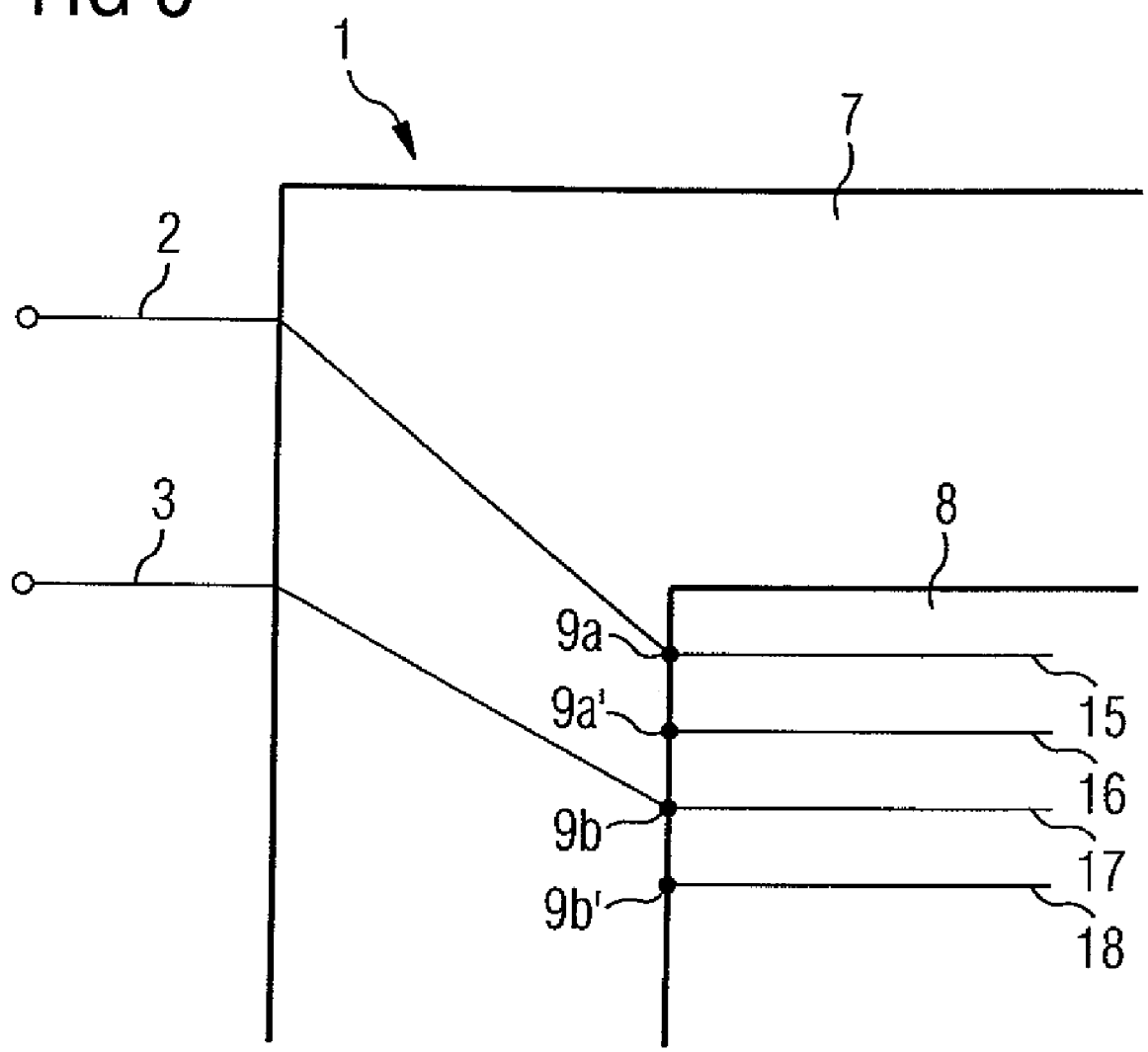

SEMICONDUCTOR DEVICE WITH TEST INTERFACE

CROSS-REFERENCE TO RELATED APPLICATIONS

This Utility Patent Application claims priority to German Patent Application No. DE 10 2005 039 348.9 filed on Aug. 19, 2005, which is incorporated herein by reference.

BACKGROUND

The invention provides a semiconductor device with a test interface, and to a method for operating a semiconductor device.

Semiconductor devices may include several ten millions of transistors and a software program of a size of several MB. In particular may the devices (e.g. micro controllers or micro processor systems) may include at least one central control or processing unit, Central Processing Units or CPU "cores". These may be connected with at least one memory device for storing a software program or data to be processed, for instance, a program or data memory.

Semiconductor devices, for instance, integrated (analog or digital) computing circuits, in particular micro processors, are subject to comprehensive tests during and after their manufacturing.

Tests are, on the one hand, carried out by the manufacturers of the devices to detect defective devices and to be able to interfere correspondingly during manufacturing, if necessary, or to check and test the software program stored on the semiconductor device.

On the other hand, the users test such semiconductor devices for their exact functionality.

From prior art, several hard and software systems are known for the simulation and emulation of such semiconductor devices by means of which semiconductor devices can be tested for defects and their functionality. During the checking of a semiconductor device, test interface means are primarily used to test or evaluate the functionality of the software of the semiconductor device in cooperation with its environment.

To this end, semiconductor devices frequently include a JTAG (Joint Test Action Group) module—defined in IEEE standard 1149—for carrying out a—standardized—test procedure. In accordance with this standard, every input and every output pin within the semiconductor device is provided with a simple additional circuit, a Boundary Scan Cell (BSC), by means of which a state at a pin can be read or set, so that the signals to be processed by the semiconductor device need not actually be applied to the pins, but can be signalized via the JTAG module at the pins.

In accordance with the above-mentioned standard, a JTAG module—provided on the corresponding semiconductor device—includes a test access port (TAP) that is connected with four or—optionally—five test pins by means of which a test clock signal TCK (TCK=Test Clock), a test mode select signal TMS (TMS=Test Mode Select), a data input signal TDI (TDI=Test Data In), a data output signal TDO (TDO=Test Data Out), and—optionally—a test reset signal TRST (TRST=Test Reset) can be input into/output from the device to be tested.

It is of disadvantage that conventional devices with JTAG module include a relatively high number of—additional—pins (namely the above-mentioned four to five JTAG test pins).

It has therefore been suggested to "multiplex" JTAG test pins and conventional function pins, so that one and the same pin—depending on whether the corresponding device is operated in a test mode or in a normal operating mode—may be used either as JTAG test pin or as function pin.

Here, it is of disadvantage that the function of the function pin—used as JTAG test pin in the test mode—cannot be tested as such, or with great effort only.

It has, in general, been a permanent object of development to restrict the number of pins of a semiconductor device to those that are necessary for normal operation. At the same time, a possibility of testing such a device in a test mode with supplied test data also has to be given.

For these and other reasons, there is a need for the present invention.

SUMMARY

The invention provides a semiconductor device with test interface, as well as to a method for operating a semiconductor device. In one embodiment, in a test operating mode, the semiconductor device is, via a first pin, supplied with a work cycle signal synchronized with a test environment and, via at least one second pin, with test data. In accordance with a first aspect it is suggested, so as to reduce the number of pins, that the work cycle signal is simultaneously used as test data clock signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 5 illustrates a schematic representation of a semiconductor chip in accordance with a further aspect of the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a novel semiconductor device with a test interface, and a novel method for operating a semiconductor device.

In accordance with one embodiment of the invention there is a method for operating a semiconductor device, wherein the semiconductor device is supplied, in a test operating mode, via a first pin with a work cycle signal synchronized with a test environment and, via at least one second pin, with test data. The work cycle signal is simultaneously used as test data clock signal.

A clock signal that is only provided for the transmission of test data, such as it is, for instance, provided as TCK pursuant to the JTAG standard, may thus be omitted, so that the number of pins is consequently reduced.

Thus, the number of pins, in particular of test pins, may be kept low, and nevertheless a clock signal is available for the supply of test data.

Figure 1:
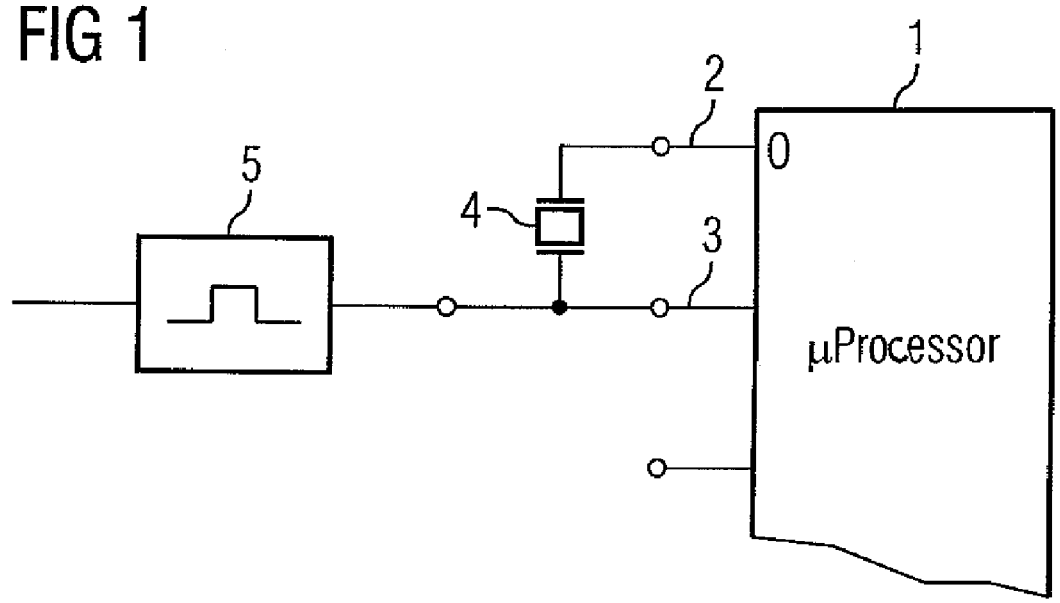
FIG. 1 illustrates a schematic representation of a semiconductor device with test interface means in accordance with an embodiment of the present invention.

FIG. 1 illustrates a semiconductor device 1 having a first pin 2 and a second pin 3. Such a semiconductor device may, for instance, be a micro processor 1 having a central processing unit as well as memories. In normal operation, i.e. when the micro processor 1 is operated productively and is not tested, the first pin 2 (Oszi1) and the second pin 3 (Oszi2) serve for the connection of an oscillating crystal 4 that is necessary for generating a clock for the micro processor 1.

The test interface means of the micro processor 1 which provides for an exchange of test data with the micro processor 1 may otherwise be designed arbitrarily and is not illustrated in more detail here.

Such test interface means are used both by the manufacturers and by the users primarily for checking and for testing the cooperation between the software of the micro processor and its environment. The detection of defects in the micro processor hardware is only a side effect.

Furthermore, such micro processors usually include a test interface, for instance, in accordance with the above-mentioned JTAG standard, via which the micro processor 1 can be supplied with data that are to be processed by the micro processor 1. The JTAG standard describes two data lines and an additional line for a data clock in this respect.

In accordance with a first embodiment, the work cycle that is synchronized with the test environment is not just used as work cycle, but also as data clock for the supply or the data exchange, respectively, of test data.

To this end, the micro processor is internally designed and equipped such that, in the test operating mode, the work cycle signal supplied is simultaneously used as data clock signal for the data exchange of test data with the test environment.

This way, the line for supplying a data clock as described in the JTAG standard may be omitted.

Figure 2:
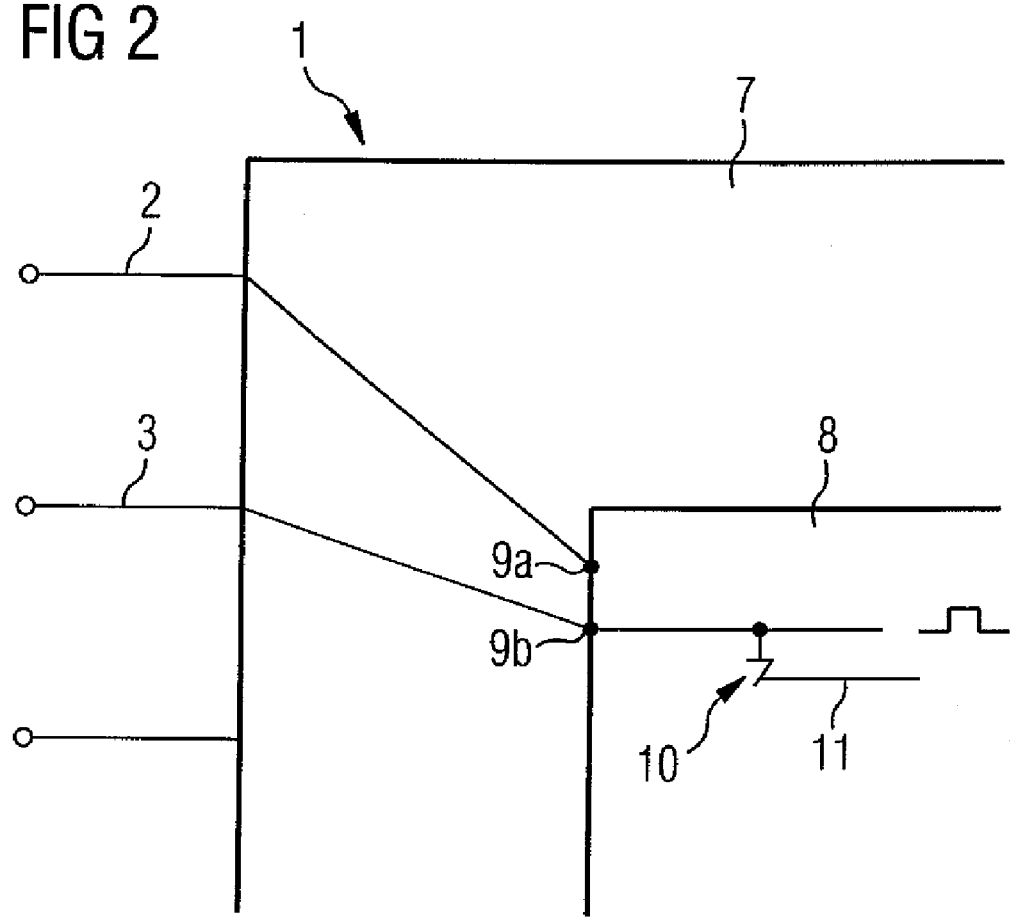
FIG. 2 illustrates a schematic representation of a semiconductor device in which the functionality of a pin is switched as a function of the operating mode.

FIG. 2 illustrates a schematic representation of the internal connections of the micro processor 1. The package 7 includes the actual chip 8 of the micro processor 1 and serves quasi as a housing for it which includes connection pins. The connection pins, for instance those that are provided for the connection with the oscillating crystal 4 in the normal operating mode, are bonded with contact points 9, the pads 9, of the chip 8. The connection pin 3 of the package 7 which is, in the test operating mode, provided for supplying the clock signal, is here bonded on the pad 9b. Within the chip 8 it may now be provided that, by using a multiplexer or switch 10 and as a function of the operating mode, the assignment of the pad 9b is different. For instance, via the multiplexer that is indicated only schematically here, the assignment of the pad 9b may, in the test operating mode, be switched such that the clock signal is also used as test data clock signal—as is illustrated. To this end, the signal directed to the pad 9b is switched to a corresponding line 11 by means of the closed multiplexer/switch 10.

In the normal operating mode, the multiplexer/switch 10 is switched such that the signal present on the pin and thus on the pad bonded therewith is only used as work cycle signal or, if an oscillating crystal 4 is connected with this pin/pad, is used for generating a work cycle signal.

Alternatively—and not illustrated here—the chip 8 might also be designed such that it includes a first connection pad that is to be connected with the oscillating crystal 4, and a second connection pad that serves to supply the data clock signal. Such a chip 8 might be offered in two packages with different bondings, namely, on the one hand, for the normal operating mode and, alternatively, a variant for the test operating mode.

In the package variant for the normal operating mode, the pin of the package 7 is connected with the pad of the chip 8 which is provided for the triggering of the oscillating crystal 4. In the variant for the test operating mode, the same pin of the package 7 is connected with that pad of the chip 8 via which the clock signal is supplied to the chip 8, which is then used as work cycle signal and as clock signal for the exchange of test data with the test environment.

Figure 3:
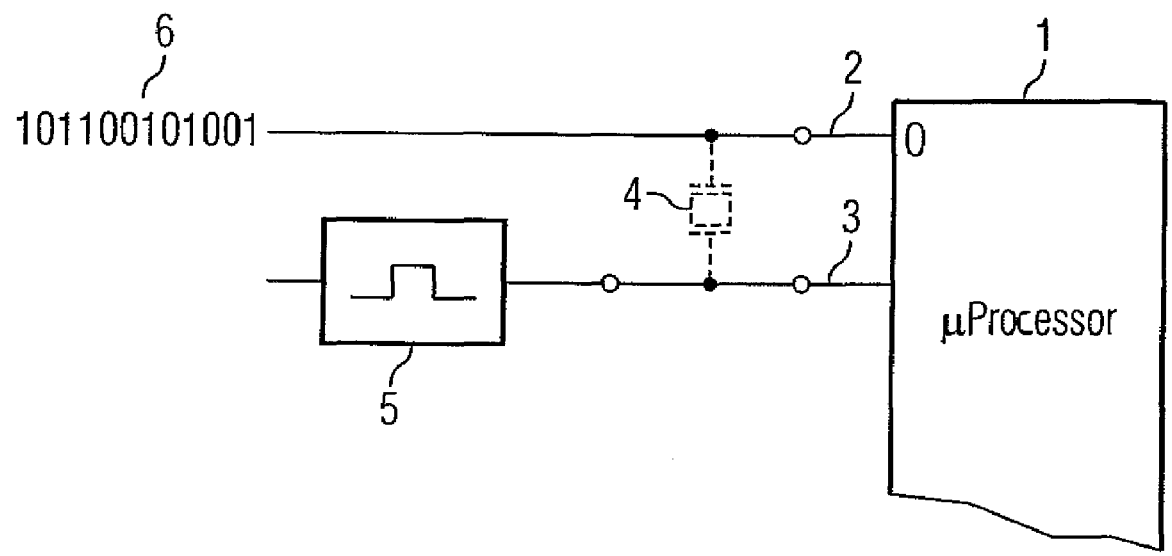
FIG. 3 illustrates a schematic representation of a semiconductor device according to a second aspect of the invention.

FIG. 3 illustrates a schematic representation of a micro processor 1 in accordance with a further embodiment of the invention.

The micro processor 1 be, here too, integrated in a—not illustrated—test environment that supplies it with supply voltage and signals which are required for the performance of tests. Via one of the connection pins 2, 3 that serve, in the normal operating mode, for the connection to an oscillating crystal 4 that is illustrated in dashes here, the micro processor 1 is supplied with a work cycle signal that is generated in the clock signal generator 5.

The second pin provided in normal operation for the connection to the oscillating crystal 4, here the pin 2, is, when integrated in the test environment, not necessary for the generation of a clock signal since the micro processor 1 is already supplied with the work cycle signal.

Via this pin 2, the micro processor 1 is now supplied with the data to be processed in the scope of the tests. In FIG. 3, this is indicated by the arrow and the digital data 6 that are indicated symbolically. The pin 2 thus obtains the function of a data supply line in the test operating mode.

In comparison to the above-described JTAG test method that provides, for the transmission of data from the test environment to the micro processor 1, a line and for the transmission in the inverse direction a second line, only one data line is provided with the instant method for transmitting the test data to the micro processor 1. However, transfer protocols for the transmission of data by means of one signal line and one clock line are sufficiently known from prior art.

The micro processor 1 is to this end designed such that it is adapted to both receive and transmit, in the test operating mode via one of the two oscillator pins 2, data that write test environment, i.e. test data, into the micro processor and read or receive same from the micro processor. In the test operating mode, data can thus be exchanged in both directions between the micro processor 1 and the test environment.

Figure 4:
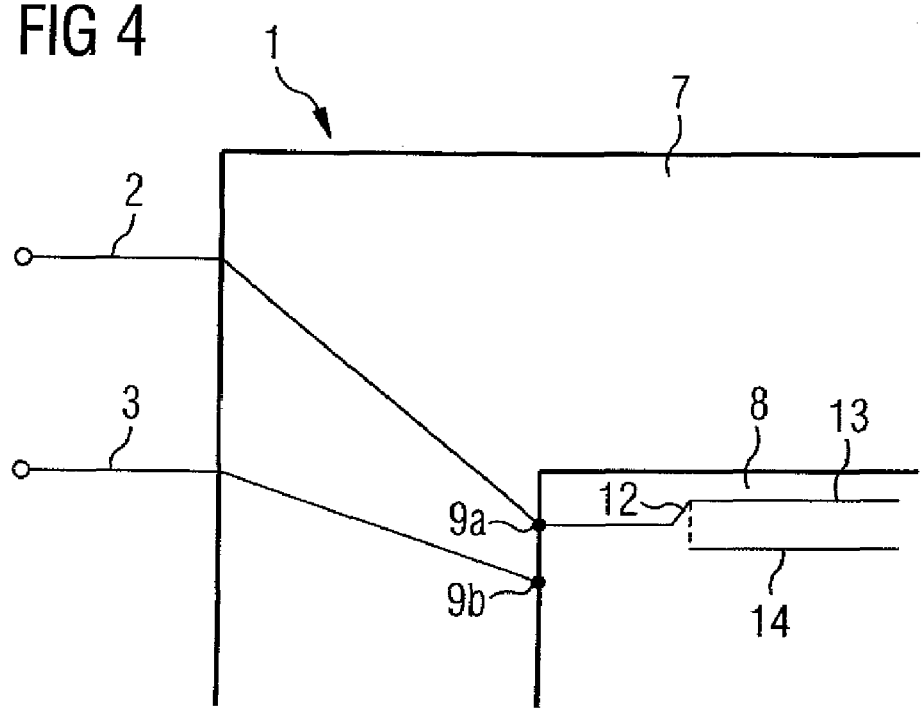
FIG. 4 illustrates a schematic representation of a semiconductor device according to the second aspect of the invention, in which the functionality of a pin is switched as a function of the operating mode.

FIG. 4 illustrates a schematic representation of the chip 8 of the semiconductor device 1 in the package 7, in which the pin 2 of the package 7 is bonded on the pad 9a of the chip 8. Within the chip 8, a switch or multiplexer 12 may be provided which connects the pad 9a with the line 13 or the line 14, depending on the operating mode. The line 13 serves to transmit the signal provided for the oscillating crystal to the pad 9a in the normal operating mode. The line 14 serves as a data line in the test operating mode, so that the connection of the pin 2 can be switched as a function of the operating mode.

As with the line for the clock signal, variants of the micro processor 1 may alternatively be provided, which are each either established for the test operating mode or for the normal operating mode, wherein the chip 8 used in the micro processor 1 remains the same. To this end, a pad 9 each may be provided for the lines 13 and 14. In the variant of the micro processor for the normal operating mode, the line 13 is then connected with the pin for connection with the oscillating crystal 4, in the variant for the test operating mode, the line 13 would be connected with the corresponding pin for data transmission.

FIG. 5 illustrates a semiconductor chip 8 according to a further aspect of the invention. The semiconductor chip 8 includes the contact pads 9a and 9a' and the contact pads 9b and 9b'. The line 15 going off the contact pad 9a be here provided for the connection with the external oscillating crystal 4 (for stimulation), the line 16 be provided for the receipt of test data. The contact pad 9b is provided for the connection with the oscillating crystal 4, and the contact pad 9b' is provided for the receipt of a clock signal supplied to the semiconductor device from outside.

The connections of the pin 2 to the contact pad 9a and of the pin 3 to the contact pad 9b as illustrated illustrate a variant, a packaging of the semiconductor chip 8, which is provided for normal operation. The connections, the bonding, are in this variant designed such that an oscillating crystal 4 can be connected via the pins 2 and 3.

In a deviating variant that is provided for test operation—and that is not illustrated here—the pin 2 is connected with the contact pad 9a', and the pin 3 with the contact pad 9b'. In this variant provided for test operation, the test data are to be supplied to the micro processor 1 via the pin 2, and the clock signal via the pin 3, the clock signal being used by the semiconductor chip 8 both as work cycle signal and as test data clock signal.

The contact pads that are not connected with a pin each remain without any function in the respective packaging variants and are fixed to a predetermined potential.

In this design, the semiconductor chip 8 enables that, on the one hand, a packaging variant for normal operation and, on the other hand, a packaging variant for test operation can be established, which only differ from each other by the connections, i.e. the bonding, of the pins 2, 3 to the contact pads 9a, 9a' or 9b, 9b'.

The above-described uses of the oscillator pins 2, 3 of a micro processor 1 in the test operating mode may also be combined with one another. In this case, test data may be transmitted to the micro processor 1 in the test operating mode without pins having to be provided at the housing of the micro processor, which are idle in the normal operating mode.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for operating a semiconductor device comprising:
    defining a normal operating mode and a test operating mode, wherein in the normal operating mode the semiconductor device is connected via two pins with an oscillator for the generation of a clock signal;
    supplying the semiconductor device in the test operating mode a work cycle signal synchronized with a test environment via a first one of the two pins and test data via a second one of the two pins, wherein the work cycle signal is simultaneously used as a test data clock signal.

2. The method according to claim 1, wherein the oscillator comprises an oscillator crystal.

3. The method according to claim 1, comprising supplying, in the test operating mode, the work cycle signal/test data clock signal via one of the oscillator pins.

4. The method according to claim 1, wherein, in a normal operating mode, providing two pins of the semiconductor device for the connection of an oscillator for the generation of a clock signal and, in the test operating mode, supplying the test data to the semiconductor device via one of the oscillator pins.

5. A semiconductor device comprising:
    a test interface including a first pin and a second pin, configured such that in a normal operating mode the first and second pins are coupled with an oscillator for generation of a clock signal, and in a test operating mode, the semiconductor device is supplied with a work cycle signal via the first pin and with test data via the second pin, wherein in the test operating mode, the supplied work cycle signal is simultaneously used as clock signal for the test data.

6. The semiconductor device according to claim 5, wherein the oscillator comprises a crystal.

7. The semiconductor device according to claim 5, which comprises:
    a housing comprising the first and second pins and a semiconductor chip with contact pads positioned therein, the contact pads being connected with the first and second pins of the housing; and
    wherein the semiconductor chip comprises a multiplexer that switches connections to the second pin such that, in the normal operating mode, the second pin serves for the connection with the oscillator and, in the test operating mode, for the receipt of the supplied work cycle/test data clock signal.

8. The semiconductor device according to claim 5, comprising:
    a housing having the first and second pins and a semiconductor chip with contact pads positioned therein, the contact pads being connected with the first and second pins of the housing; and
    wherein the semiconductor chip comprises a multiplexer that switches the connections to the first pin such that, in the normal operating mode, the first pin serves for the connection with the oscillator and, in the test operating mode, for the receipt of the supplied test data.

9. A method for operating a semiconductor device having at least a first pin and a second pin, the method comprising:
    connecting the semiconductor device, in a normal operating mode, with an oscillator for generation of a clock signal via the first and second pins;
    supplying the semiconductor device, in a test operating mode, with a work cycle signal synchronized with a test environment via the first pin and with test data via the second pin, including simultaneously using the work cycle signal as a test data clock signal.

10. The method according to claim 9, comprising:
using a multiplexer to switch between the test operating mode and a normal operating mode.

11. The method according to claim 9, wherein the oscillator comprises an oscillator crystal.

12. A system comprising a microprocessor having at least two pins, the microprocessor connected via the at least two pins with an oscillating crystal for the generation of a clock signal in a normal operating mode, and the microprocessor supplied with a work cycle signal synchronized with a test environment via a first one of the two pins and with test data via a second one of the two pins in a test operating mode, wherein in the test operating mode the work cycle signal is simultaneously used as a test data clock signal.

* * * * *